(12) United States Patent
Ishihara et al.

(10) Patent No.: US 10,680,561 B2
(45) Date of Patent: Jun. 9, 2020

(54) POWER AMPLIFIER MODULE

(71) Applicant: Murata Manufacturing Co., Ltd., Kyoto (JP)

(72) Inventors: Shota Ishihara, Kyoto (JP); Yuji Shintomi, Kyoto (JP); Satoshi Matsumura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/263,384

(22) Filed: Jan. 31, 2019

(65) Prior Publication Data

US 2019/0165742 A1 May 30, 2019

Related U.S. Application Data

(63) Continuation of application No. 15/682,897, filed on Aug. 22, 2017, now Pat. No. 10,236,834.

(30) Foreign Application Priority Data

Aug. 23, 2016 (JP) .................................. 2016-163064

(51) Int. Cl.
*H03F 3/193* (2006.01)
*H03F 1/56* (2006.01)
*H03F 3/195* (2006.01)
*H03H 7/38* (2006.01)

(52) U.S. Cl.
CPC .............. *H03F 1/565* (2013.01); *H03F 3/193* (2013.01); *H03F 3/195* (2013.01); *H03H 7/38* (2013.01); *H03F 2200/225* (2013.01); *H03F 2200/237* (2013.01); *H03F 2200/387* (2013.01); *H03F 2200/391* (2013.01); *H03F 2200/402* (2013.01); *H03F 2200/451* (2013.01); *H03F 2203/21124* (2013.01)

(58) Field of Classification Search
CPC ........... H03F 3/191; H03F 3/193; H03F 3/195
USPC .................................................. 330/302, 305
See application file for complete search history.

(56) References Cited

U.S. PATENT DOCUMENTS

| 8,160,518 B2 | 4/2012 | Ray et al. |
| 2011/0234317 A1 | 9/2011 | Arai et al. |
| 2013/0063223 A1 | 3/2013 | See |

FOREIGN PATENT DOCUMENTS

| JP | 2007-329641 A | 12/2007 |
| JP | 2009-302748 A | 12/2009 |
| WO | 2014/013869 A1 | 1/2014 |

*Primary Examiner* — Steven J Mottola
(74) *Attorney, Agent, or Firm* — Pearne & Gordon LLP

(57) ABSTRACT

A power amplifier module includes an amplifier that amplifies an input signal and outputs the amplified signal, a harmonic termination circuit that is disposed subsequent to the amplifier and that attenuates a harmonic component of the amplified signal, the harmonic termination circuit including at least one field effect transistor (FET), and a control circuit that controls a gate voltage of the at least one FET to adjust a capacitance value of a parasitic capacitance of the at least one FET. The control circuit adjusts the capacitance value of the parasitic capacitance of the at least one FET, and thereby a resonance frequency of the harmonic termination circuit is adjusted.

11 Claims, 10 Drawing Sheets

POWER AMPLIFIER MODULE

This is a continuation of U.S. patent application Ser. No. 15/682,897 filed on Aug. 22, 2017 which claims priority from Japanese Patent Application No. 2016-163064 filed on Aug. 23, 2016. The contents of these applications are incorporated herein by reference in their entireties.

BACKGROUND

The present disclosure relates to a power amplifier module. In a mobile terminal that uses a communication network for cellular phones, a power amplifier module is used to amplify power of a radio frequency (RF) signal to be transmitted to a base station. In the power amplifier module, a harmonic termination circuit is used to attenuate a harmonic component of an amplified signal that is output from an amplifier (a signal having a frequency that is an integer multiple of the fundamental frequency of the amplified signal). For example, Japanese Unexamined Patent Application Publication No. 2009-302748 discloses a harmonic termination circuit that is constituted by an inductor-capacitor (LC) series resonance circuit and whose characteristics can be changed in accordance with the signal mode.

With the recent reduction in the profile of substrates on which power amplifier modules are mounted and increase in the frequencies of RF signals (for example, frequencies of about 3.5 GHz or higher), the characteristics of a harmonic termination circuit may deteriorate due to variations from element to element, which could be a problem. In this regard, in the circuit disclosed in Japanese Unexamined Patent Application Publication No. 2009-302748, the sizes of elements such as inductors and a capacitor are determined in advance and it is difficult to adjust the characteristics of the harmonic termination circuit in accordance with the variations of the elements.

BRIEF SUMMARY

Accordingly, the present disclosure provides a power amplifier module in which deterioration of the characteristics of a harmonic termination circuit is mitigated even if variations are present from element to element.

According to embodiments of the present disclosure, a power amplifier module includes an amplifier that amplifies an input signal and outputs the amplified signal, a harmonic termination circuit that is disposed subsequent to the amplifier and that attenuates a harmonic component of the amplified signal, the harmonic termination circuit including at least one field effect transistor (FET), and a control circuit that controls a gate voltage of the at least one FET to adjust a capacitance value of a parasitic capacitance of the at least one FET. The control circuit adjusts the capacitance value of the parasitic capacitance of the at least one FET, and thereby a resonance frequency of the harmonic termination circuit is adjusted.

According to embodiments of the present disclosure, it is possible to provide a power amplifier module in which deterioration of the characteristics of a harmonic termination circuit is mitigated even if variations are present from element to element.

Other features, elements, characteristics and advantages of the present disclosure will become more apparent from the following detailed description of embodiments of the present disclosure with reference to the attached drawings.

DETAILED DESCRIPTION

Figure 1:
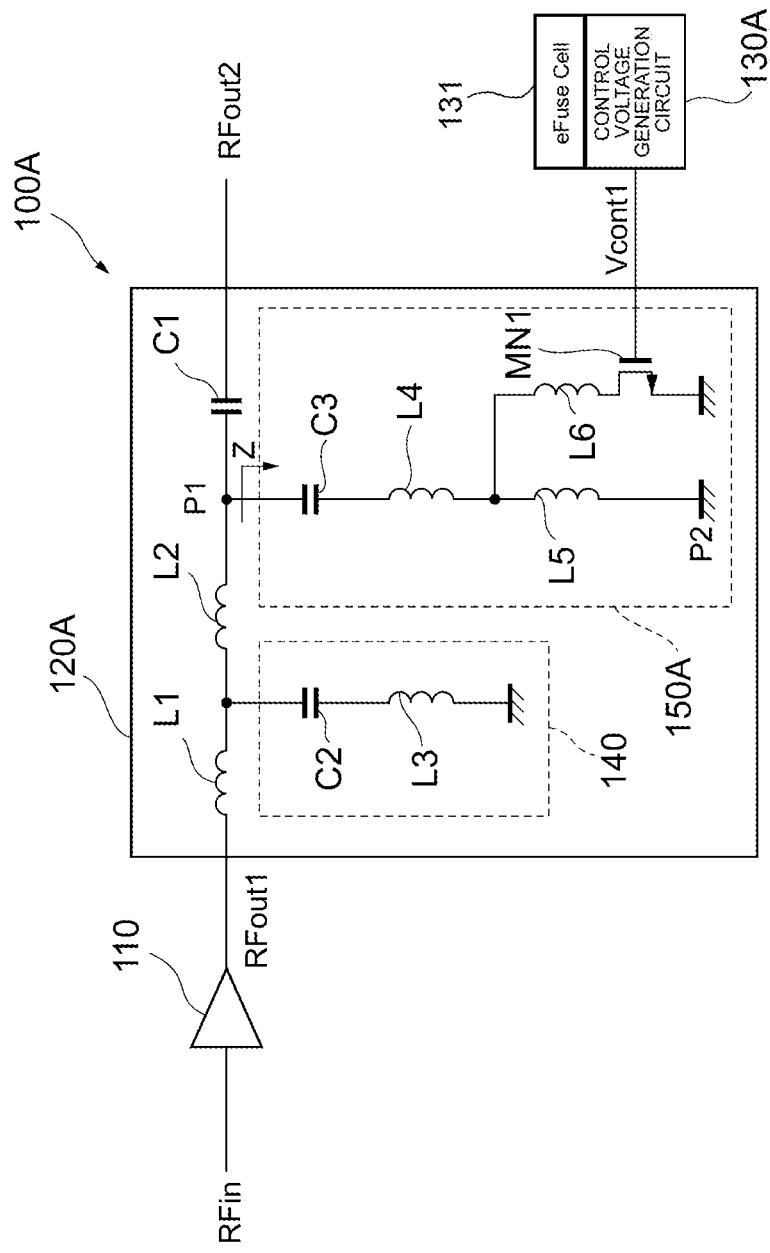
FIG. 1 is a diagram illustrating a configuration of a power amplifier module according to a first embodiment of the present disclosure.

Embodiments of the present disclosure will be described with reference to the drawings. FIG. 1 is a diagram illustrating a configuration of a power amplifier module 100A according to a first embodiment of the present disclosure. The power amplifier module 100A is a module that amplifies an input signal RFin, which is a radio frequency (RF) signal, and that outputs an amplified signal RFout2. The power amplifier module 100A includes, for example, an amplifier 110, a matching circuit 120A, and a control voltage generation circuit 130A. In FIG. 1, other constituent elements of the power amplifier module 100A (e.g., a choke inductor, a bias circuit, etc.) are not illustrated for simplification of illustration.

The amplifier 110 amplifies the input signal RFin and outputs an amplified signal RFout1. The amplifier 110 includes a transistor for amplification. The transistor for amplification is a bipolar transistor such as a heterojunction bipolar transistor (HBT), for example. The transistor for amplification may be a field effect transistor (FET).

The matching circuit 120A is disposed between the amplifier 110 and a subsequent circuit (e.g., a switch circuit) and matches the output impedance of the amplifier 110 and the input impedance of the subsequent circuit. The amplified signal RFout1 output from the amplifier 110 is output as the amplified signal RFout2 via the matching circuit 120A. The matching circuit 120A includes, for example, inductors L1 and L2, a capacitor C1, and harmonic termination circuits 140 and 150A.

The inductor L1, the inductor L2, and the capacitor C1 are connected in series in this order. A first end of the inductor L1 is connected to an output terminal of the amplifier 110, and the amplified signal RFout2 is output from a second end of the capacitor C1. The capacitor C1 also functions as a DC-cut capacitor for removing the direct-current (DC) component of the amplified signal RFout1.

The harmonic termination circuits 140 and 150A are each an inductor-capacitor (LC) series resonance circuit that includes an inductor and a capacitor. The LC series resonance circuit has a function of attenuating frequency components near the resonance frequency. Thus, the LC series resonance circuit is designed such that the resonance frequency coincides with a harmonic (for example, second harmonic) frequency of the input signal RFin, and thereby the harmonic component included in the amplified signal RFout1 can be attenuated. For example, when the LC series resonance circuit is constituted by an inductor having an inductance L and a capacitor having a capacitance C, the resonance frequency $f_0$ is expressed by $f_0=1/2\pi\sqrt{LC}$.

The harmonic termination circuit 140 includes, for example, a capacitor C2 and an inductor L3 that are connected in series. The capacitor C2 has a first end connected to a node between the inductor L1 and the inductor L2, and a second end connected to a first end of the inductor L3. A second end of the inductor L3 is grounded.

The harmonic termination circuit 150A has a structure that enables at least one of a capacitance and an inductance of the LC series resonance circuit to be adjusted. Specifically, for example, the harmonic termination circuit 150A includes a capacitor C3, inductors L4 and L5 (first inductor), an inductor L6 (second inductor), and an FET (MN1).

The capacitor C3, the inductor L4, and the inductor L5 are connected in series in this order. The capacitor C3 has a first end connected to a node between the inductor L2 and the capacitor C1, and a second end connected to a first end of the inductor L4. The inductor L5 has a first end connected to a second end of the inductor L4, and a second end grounded (that is, supplied with a reference potential). The inductor L6 is connected in parallel with the inductor L5. The inductor L6 has a first end connected to a node between the inductor L4 and the inductor L5, and a second end connected to the drain of the FET (MN1). The inductor L6 is an inductor for adjusting the combined inductance in the harmonic termination circuit 150A.

The FET (MN1) is an N-channel metal oxide semiconductor FET (MOSFET), for example, and has the drain, which is connected to the second end of the inductor L6, a gate to which a control voltage Vcont1 is supplied from the control voltage generation circuit 130A, and a source grounded. The functions of the FET (MN1) will be described in detail below.

The control voltage generation circuit 130A (control circuit) generates the control voltage Vcont1 and supplies the control voltage Vcont1 to the gate of the FET (MN1). The control voltage generation circuit 130A controls the control voltage Vcont1 as appropriate in accordance with an offset between the resonance frequency of the harmonic termination circuit 150A and the harmonic frequency of the input signal RFin. The control voltage generation circuit 130A may include, for example, a control integrated circuit (IC) and a digital-to-analog (DA) converter and may be configured such that the DA converter generates an output voltage in accordance with a control signal output from the control IC. The control voltage generation circuit 130A may have any other configuration.

Next, a description will be given of the function of adjusting the capacitance and the inductance in this embodiment. An FET typically has a parasitic capacitance between the drain and the source thereof. Specifically, the parasitic capacitance is known to be increased by increasing the gate voltage of the FET or by increasing the gate width or gate length of the FET. Accordingly, the parasitic capacitance of an FET can be controlled to adjust the combined capacitance in a circuit including the FET. In the harmonic termination circuit 150A, since the control voltage Vcont1 supplied to the gate of the FET (MN1) is controlled, the parasitic capacitance is adjusted and the combined capacitance in the harmonic termination circuit 150A is adjusted.

In addition, the gate voltage of the FET (MN1) is controlled and thereby the on and off states of the FET (MN1) are switched. The conduction and non-conduction of current through the inductor L6 connected in series with the FET (MN1) are also switched accordingly. Thus, the control voltage Vcont1 is controlled and thereby the combined inductance in the harmonic termination circuit 150A is adjusted.

Figure 2:
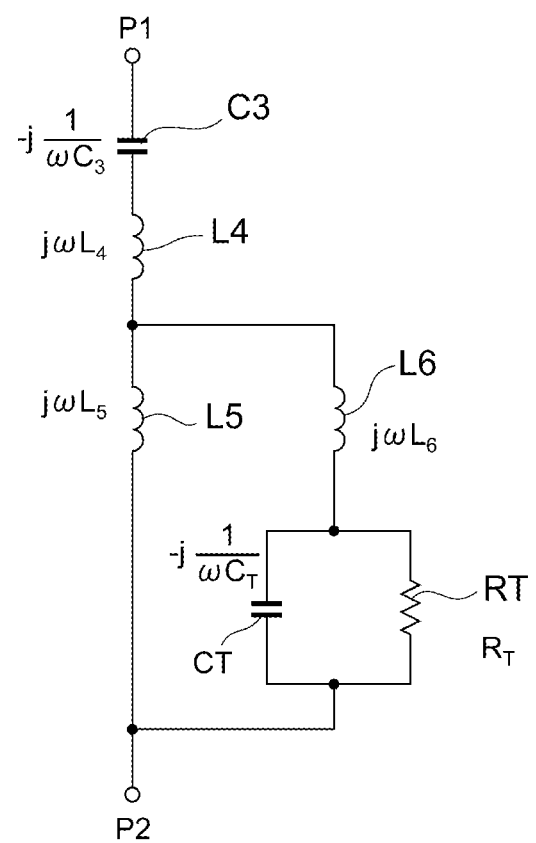
FIG. 2 is a diagram illustrating an equivalent circuit of a harmonic termination circuit in the power amplifier module illustrated in FIG. 1.

FIG. 2 is a diagram illustrating an equivalent circuit of the harmonic termination circuit 150A. An FET typically includes a parasitic capacitance and an on-resistance. Accordingly, in FIG. 2, the FET (MN1) is represented by a capacitor CT and a resistance element RT that are connected in parallel. The elements illustrated in FIG. 2 are assumed to have the following impedances.

Capacitor C3: $-j\times(1/(\omega C_3))$
Capacitor CT: $-j\times(1/(\omega C_T))$
Inductor L4: $j\omega L_4$
Inductor L5: $j\omega L_5$
Inductor L6: $j\omega L_6$
Resistance element RT: $R_T$ Here, ω denotes the angular frequency corresponding to the center frequency of the alternating-current signal supplied to the harmonic termination circuit 150A. A combined impedance Z between P1 and P2 illustrated in FIG. 2 (that is, the combined impedance Z of the harmonic termination circuit 150A, as viewed from a node P1 illustrated in FIG. 1) is expressed by Equation (1) as follows.

$$Z = \frac{(\omega L_5)^2 A R_T}{R_T^2 + (B + \omega L_5 A)^2} + j\left(\frac{\omega^2 L_4 C_3 - 1}{\omega C_3} + \frac{\omega L_5 (B + \omega L_5 A + R_T^2)}{R_T^2 + (B + \omega L_5 A)^2}\right) \quad (1)$$

In Equation (1), $A=(\omega C_T R_T)^2+1$ and $B=\omega L_6\{(\omega C_T R_T)^2+1\}-\omega C_T R_T$ hold. In Equation (1), when the imaginary part is 0 (that is, when Equation (2) below is satisfied), ω ($=\omega_0$) is the resonance frequency (angular frequency) of the harmonic termination circuit 150A and the resonance frequency $f_0$ (Hz) is given by $f_0=\omega_0/2\pi$.

$$\frac{\omega^2 L_4 C_3 - 1}{\omega C_3} + \frac{\omega L_5 (B + \omega L_5 A + R_T^2)}{R_T^2 + (B + \omega L_5 A)^2} = 0 \quad (2)$$

In this embodiment, the gate voltage of the FET (MN1) is controlled and thereby the capacitance value (i.e., $C_T$) of the parasitic capacitance and the resistance value (i.e., $R_T$) of the on-resistance vary. Specifically, as the gate voltage of the FET (MN1) increases, the capacitance value of the parasitic capacitance increases and the resistance value of the on-resistance decreases. The on and off states of the FET (MN1) are switched and thereby the conduction and non-conduction of current through the inductor L6 are also switched. Accordingly, it is found from Equation (1) that the combined impedance Z varies and the resonance frequency $\omega_0$ of the harmonic termination circuit 150A can be adjusted. Specifically, if there is an offset between the resonance frequency of the harmonic termination circuit 150A and the harmonic frequency of the input signal RFin, the resonance frequency of the harmonic termination circuit 150A can be corrected so that the resonance frequency becomes close to the harmonic frequency of the input signal RFin.

With the configuration described above, the power amplifier module 100A controls the control voltage Vcont1 supplied to the gate of the FET (MN1) in accordance with the offset between the resonance frequency of the harmonic termination circuit 150A and the harmonic frequency of the input signal RFin and can thus adjust the combined impedance Z of the harmonic termination circuit 150A and adjust the resonance frequency of the harmonic termination circuit 150A. Therefore, even if variations are present from element to element, deterioration of the characteristics of a harmonic termination circuit is mitigated by correcting the resonance frequency of the harmonic termination circuit.

The harmonic component to be attenuated by the harmonic termination circuits 140 and 150A is not limited to that of the second harmonic and may be that of the third or higher order harmonic. The harmonic termination circuit 150A includes the inductors L4 and L5, which are connected in series, rather than the inductor L3 in the harmonic termination circuit 140. The harmonic termination circuit 150A may include a single inductor instead of the separate inductors L4 and L5. The configuration in which the inductor L3 is divided into the inductors L4 and L5 and the inductor L6 used for adjustment is connected in parallel with only the inductor L5 can reduce the size of the inductor L6 used for adjustment.

Figure 3:
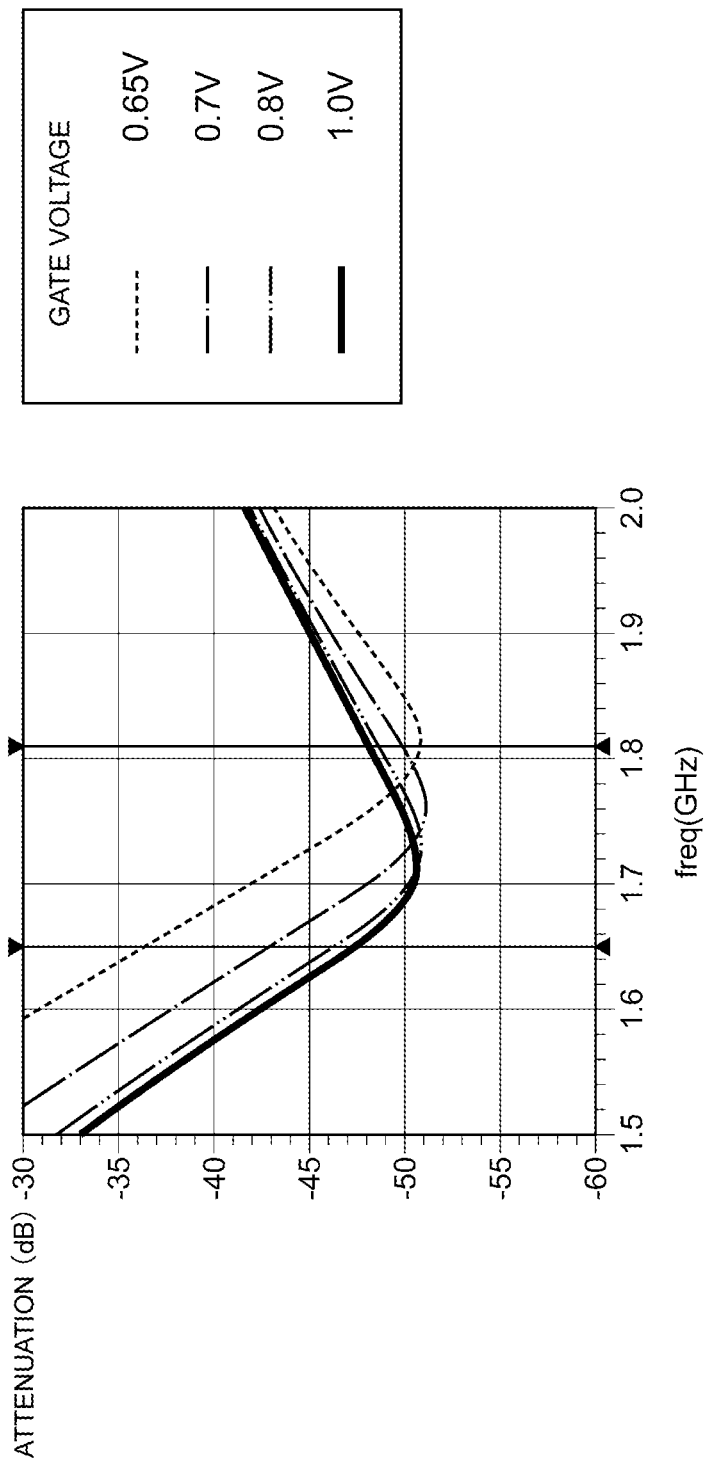
FIG. 3 is a diagram illustrating results obtained from simulation of signal attenuation in the harmonic termination circuit.

FIG. 3 is a diagram illustrating results obtained from simulation of signal attenuation in the harmonic termination circuit 150A. In FIG. 3, the horizontal axis represents frequency (GHz) and the vertical axis represents signal attenuation (dB) in the harmonic termination circuit 150A. The graph illustrated in FIG. 3 depicts how signal attenuation varies when the gate voltage of the FET (MN1) is set to about 0.65 V, about 0.7 V, about 0.8 V, and about 1.0 V in a case where the target value of the harmonic frequency to be attenuated falls within the range of about 1.65 to 1.81 GHz. In this simulation, the FET (MN1) has a gate length of about 10 μm and a gate width of about 400 μm.

As illustrated in FIG. 3, it is found that the resonance frequency of the harmonic termination circuit 150A can be corrected to a desired value by controlling the gate voltage of the FET (MN1) in the harmonic termination circuit 150A. For example, in the example illustrated in FIG. 3, when the gate voltage is about 0.8 V, the resonance frequency lies at substantially the center of the range of harmonic components and the harmonic components in this range are substantially evenly attenuated. By adjusting the gate voltage to, for example, about 0.8 V, therefore, deterioration of the characteristics of the harmonic termination circuit 150A can be mitigated. In this simulation, as the gate voltage increases, the resonance frequency shifts toward lower frequencies.

Figure 4:
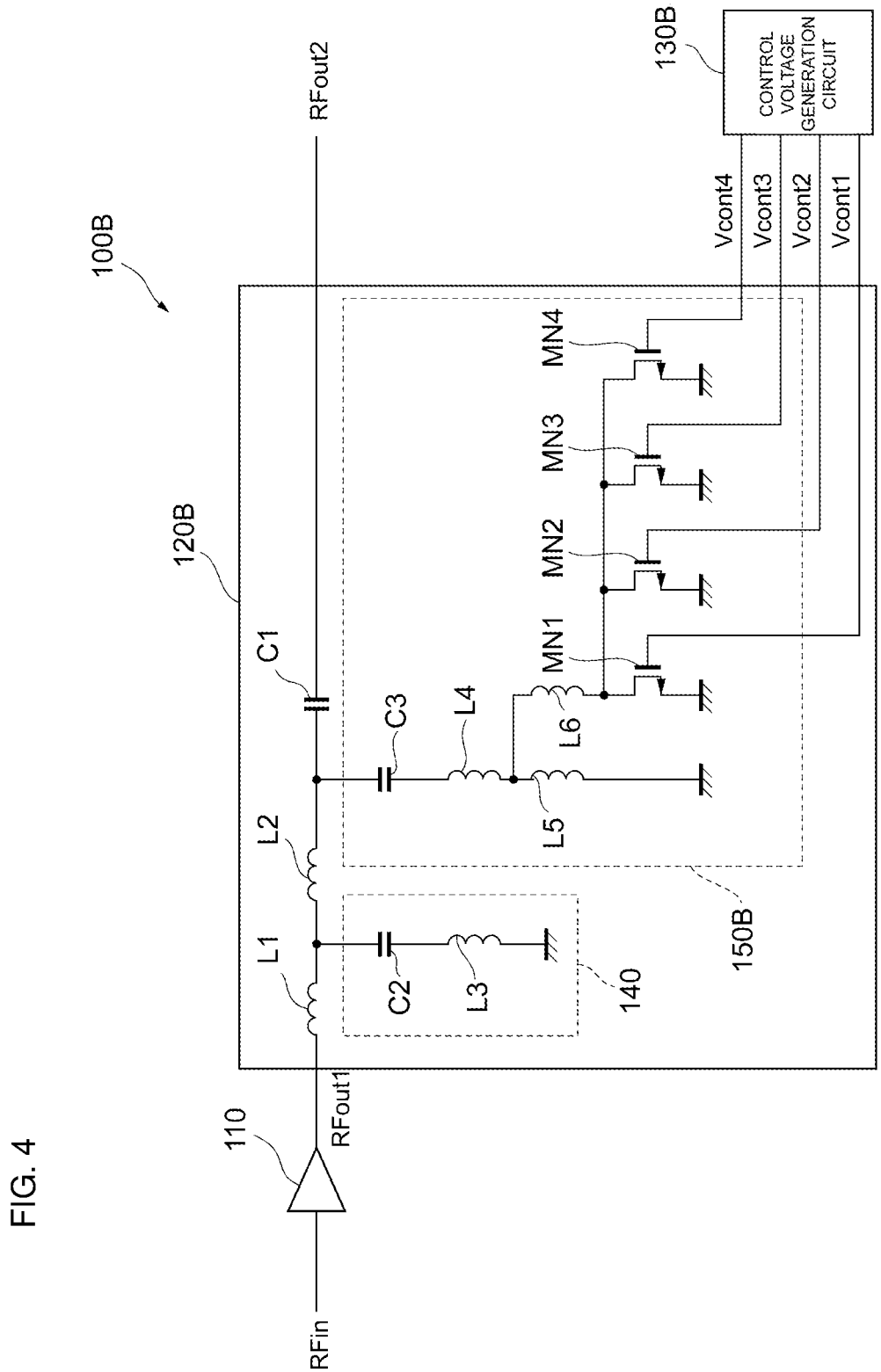
FIG. 4 is a diagram illustrating a configuration of a power amplifier module according to a modification of the first embodiment of the present disclosure.

FIG. 4 is a diagram illustrating a configuration of a power amplifier module according to a modification of the first embodiment of the present disclosure. Unlike the power amplifier module 100A illustrated in FIG. 1, a power amplifier module 100B illustrated in FIG. 4 includes a matching circuit 120B in place of the matching circuit 120A, and a control voltage generation circuit 130B in place of the control voltage generation circuit 130A. The matching circuit 120B includes a harmonic termination circuit 150B in place of the harmonic termination circuit 150A. In this modification and the following embodiment, portions which are common to the first embodiment are not described and only the differences are described. In particular, similar operations and effects achieved with similar configurations are not repeatedly described in the individual embodiments.

Unlike the harmonic termination circuit 150A, the harmonic termination circuit 150B further includes FETs (MN2, MN3, and MN4). The FETs (MN2, MN3, and MN4) are connected in parallel with the FET (MN1). That is, the FETs (MN1, MN2, MN3, and MN4) have drains connected to the second end of the inductor L6, gates to which control voltages Vcont1, Vcont2, Vcont3, and Vcont4 are supplied, respectively, and sources grounded.

The control voltage generation circuit 130B generates the control voltages Vcont1 to Vcont4 and supplies the control voltages Vcont1 to Vcont4 to the gates of the FETs (MN1 to MN4), respectively, to individually control the respective gate voltages of the FETs (MN1 to MN4). Specifically, for example, the control voltage generation circuit 130B generates either a voltage to turn on each of the FETs (MN1 to MN4) (for example, a voltage greater than or equal to a threshold voltage for the corresponding FET) or a voltage to turn off each of the FETs (MN1 to MN4) (for example, 0 V) and outputs the generated voltage as each of the control voltages Vcont1 to Vcont4. In this manner, by individually controlling the respective voltage values of the control voltages Vcont1 to Vcont4, the combination of the on and off states of the FETs (MN1 to MN4) can be variously changed. Thus, the combined capacitance that is the sum of the respective parasitic capacitances of the FETs (MN1 to MN4) can be adjusted. The FETs (MN1 to MN4) may be configured to have an element size ratio of 1:2:4:8, for example.

Also in the configuration described above, similarly to the power amplifier module 100A, the power amplifier module 100B controls the control voltages Vcont1 to Vcont4 in accordance with the offset between the resonance frequency of the harmonic termination circuit 150B and the harmonic frequency of the input signal RFin and can thus adjust the combined impedance Z of the harmonic termination circuit 150B and adjust the resonance frequency of the harmonic termination circuit 150B. Therefore, even if variations are present from element to element, deterioration of the characteristics of a harmonic termination circuit is mitigated by correcting the resonance frequency of the harmonic termination circuit.

The harmonic termination circuit 150B may be designed such that, in an initial state, any FET (for example, two FETs) among the plurality of FETs is in the on state and the remaining FETs (for example, the remaining two FETs) are in the off state. The number of FETs turned on is increased when the resonance frequency is higher than the target value, and the number of FETs turned on is decreased when the resonance frequency is lower than the target value. As a result, the resonance frequency can be corrected to either a high or low frequency.

In this embodiment, reference has been made to an example in which the control voltages Vcont1 to Vcont4 are used for binary control to switch between the on and off states of the FETs (MN1 to MN4). However, the control voltages Vcont1 to Vcont4 may have consecutive voltage values, as in the power amplifier module 100A. The number of FETs connected in parallel is not limited to four, and two, three, or more than four FETs may be connected in parallel.

Figure 5:
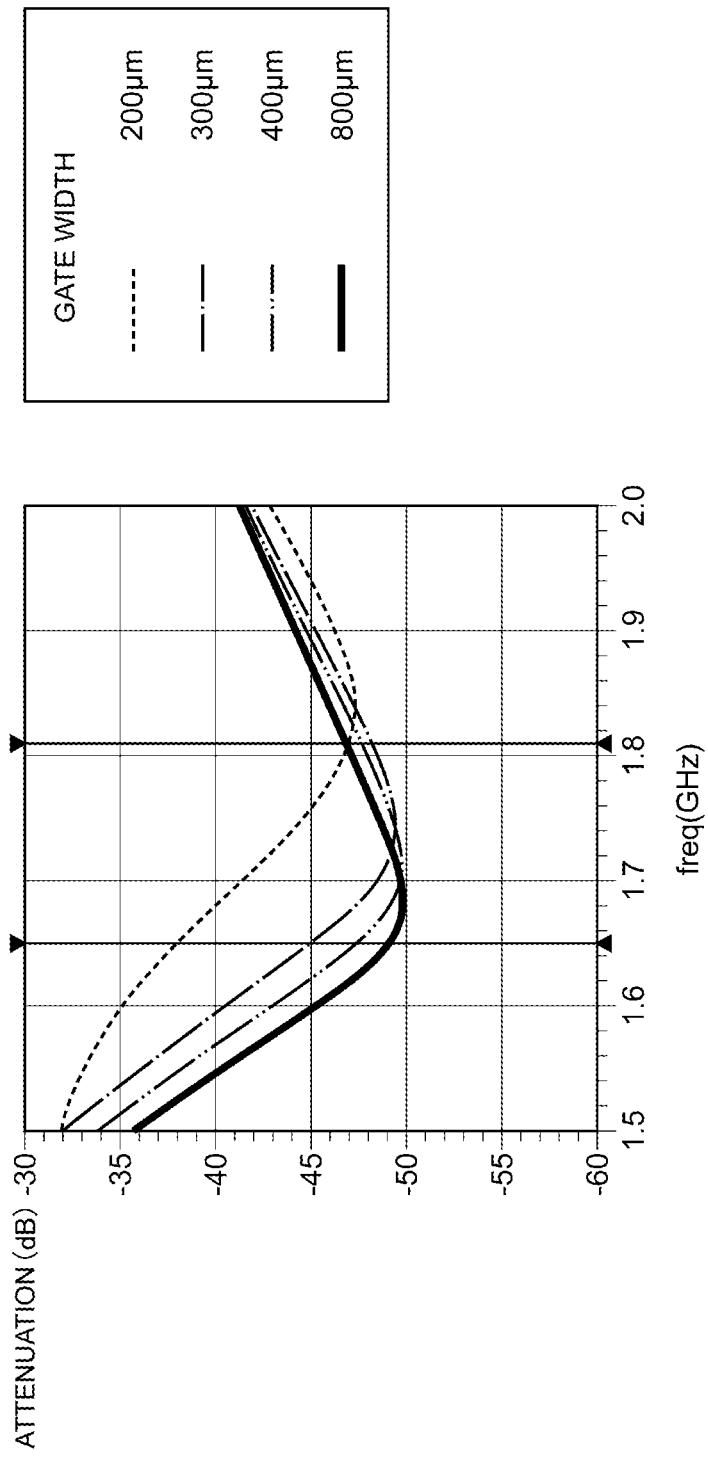
FIG. 5 is a diagram illustrating results obtained from simulation of signal attenuation in a harmonic termination circuit in the power amplifier module illustrated in FIG. 4.

FIG. 5 is a diagram illustrating results obtained from simulation of signal attenuation in the harmonic termination circuit 150B. In FIG. 5, the horizontal axis represents frequency (GHz) and the vertical axis represents signal attenuation (dB) in the harmonic termination circuit 150B. The graph illustrated in FIG. 5 depicts how signal attenuation varies when the number of FETs turned on is changed in a case where the target value of the harmonic frequency to be attenuated falls within the range of about 1.65 to 1.81 GHz. In this simulation, the on and off states of the FETs (MN1 to MN4) are not switched but the gate widths of the FETs are set to about 200 μm, about 300 μm, about 400 μm, and about 800 μm (the gate lengths of the FETs being about 10 μm) to equivalently represent the on and off operations of the FETs.

As illustrated in FIG. 5, it is found that the resonance frequency of the harmonic termination circuit 150B can be corrected to a desired value by changing the gate widths of the FETs (that is, by changing the number of FETs turned on) in the harmonic termination circuit 150B. Specifically, it is found that the larger the number of FETs turned on, the lower the resonance frequency and that the smaller the number of FETs turned on, the higher the resonance frequency. In this simulation, when the gate width is about 400 μm, the resonance frequency lies at substantially the center of the range of harmonic components and the harmonic components in this range are substantially evenly attenuated. Therefore, a circuit configuration equivalent to an FET having a gate width of about 400 μm, for example, can mitigate deterioration of the characteristics of a harmonic termination circuit.

Figure 6:
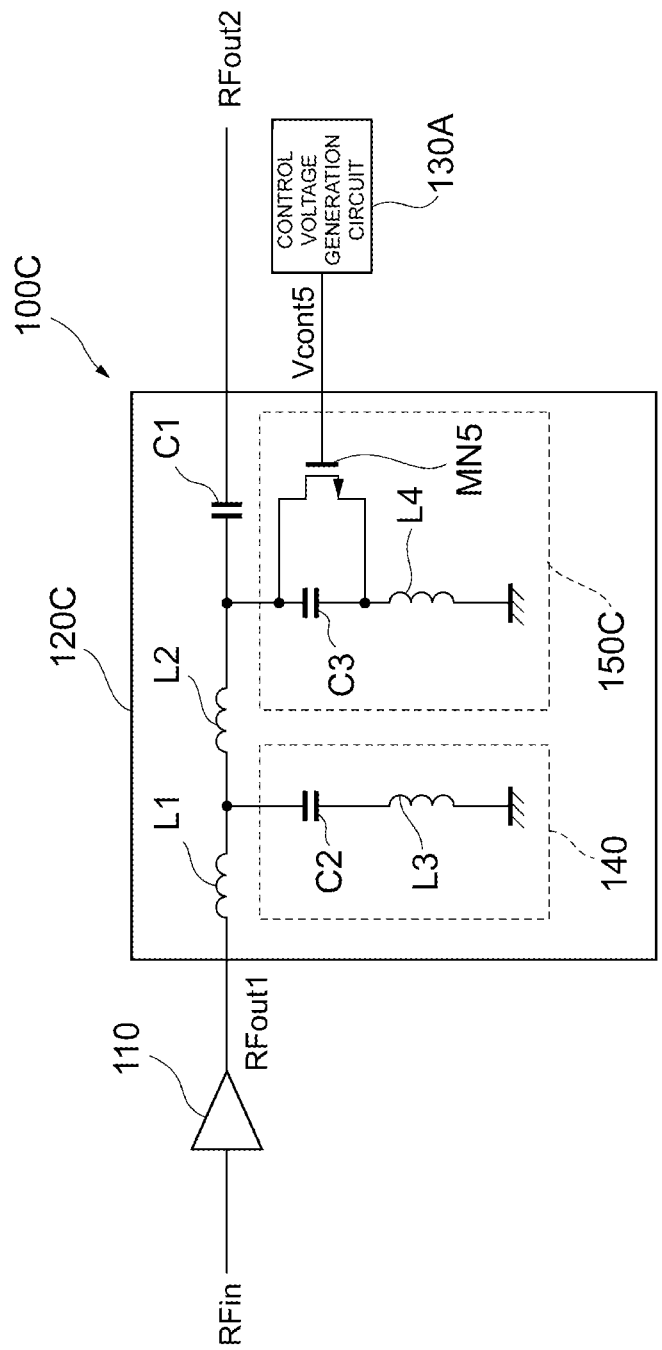
FIG. 6 is a diagram illustrating a configuration of a power amplifier module according to a second embodiment of the present disclosure.

FIG. 6 is a diagram illustrating a configuration of a power amplifier module according to a second embodiment of the present disclosure. Unlike the power amplifier module 100A illustrated in FIG. 1, a power amplifier module 100C illustrated in FIG. 6 includes a matching circuit 120C in place of the matching circuit 120A. The matching circuit 120C includes a harmonic termination circuit 150C in place of the harmonic termination circuit 150A.

The harmonic termination circuit 150C has a structure that enables the capacitance to be adjusted among the capacitance and the inductance in the LC series resonance circuit. Specifically, the harmonic termination circuit 150C includes, for example, an FET (MN5) connected in parallel with the capacitor C3. The FET (MN5) has a drain connected to the first end of the capacitor C3, a gate to which a control voltage Vcont5 is supplied from the control voltage generation circuit 130A, and a source connected to the second end of the capacitor C3.

Also in the harmonic termination circuit 150C, as in the harmonic termination circuit 150A illustrated in FIG. 1, the control voltage Vcont5 to be supplied to the gate of the FET (MN5) is controlled and thereby the parasitic capacitance of the FET (MN5) is adjusted. Thus, the combined capacitance of the harmonic termination circuit 150C is adjusted and the resonance frequency of the harmonic termination circuit 150C is corrected. In this embodiment, for example, when the resonance frequency is higher than the target value, the control voltage Vcont5 is increased to increase the parasitic capacitance of the FET (MN5). Thus, the combined capacitance of the harmonic termination circuit 150C is also increased and thereby the resonance frequency can be decreased. Also with this configuration, the power amplifier module 100C can attain effects similar to those of the power amplifier module 100A illustrated in FIG. 1.

Figure 7:
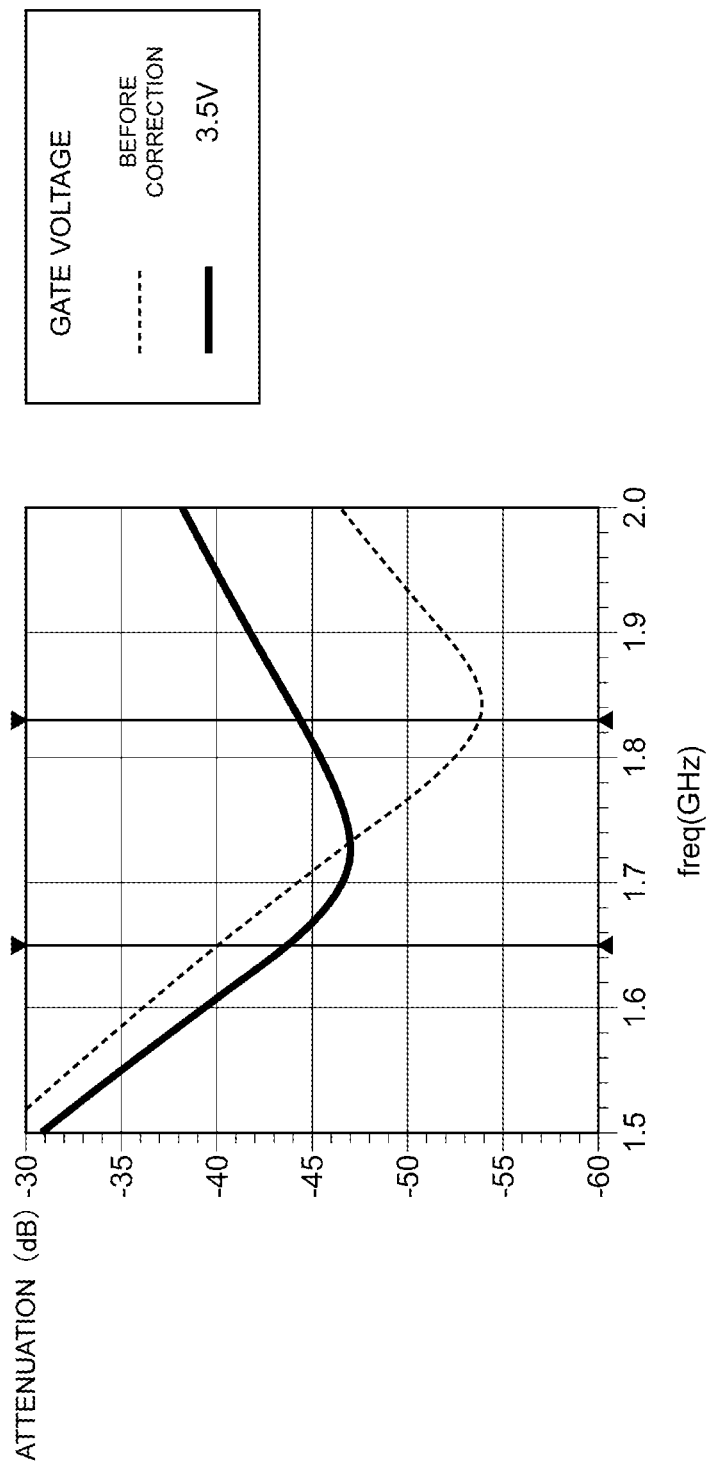
FIG. 7 is a diagram illustrating results obtained from simulation of signal attenuation in a harmonic termination circuit in the power amplifier module illustrated in FIG. 6.

FIG. 7 is a diagram illustrating results obtained from simulation of signal attenuation in the harmonic termination circuit 150C. In FIG. 7, the horizontal axis represents frequency (GHz) and the vertical axis represents signal attenuation (dB) in the harmonic termination circuit 150C. The graph illustrated in FIG. 7 depicts how signal attenuation varies when the gate voltage of the FET (MN5) is set to about 3.5 V in a case where the target value of the harmonic frequency to be attenuated falls within the range of about 1.65 to 1.81 GHz. In this simulation, the FET (MN5) has a gate length of about 10 μm and a gate width of about 400 μm.

As illustrated in FIG. 7, it is found that the resonance frequency of the harmonic termination circuit 150C can be corrected by appropriately controlling the gate voltage of the FET (MN5) in the harmonic termination circuit 150C. Specifically, before correction (that is, the gate voltage of the FET (MN5) is about 0 V), the resonance frequency shifts toward the upper limit (toward about 1.81 GHz) of the harmonic frequency to be attenuated and there is a difference in signal attenuation level in this range. On the other hand, it is found that the gate voltage of the FET (MN5) is increased to about 3.5 V, which results in the resonance frequency being moved to substantially the center of this range and the harmonic components in this range being substantially evenly attenuated. By adjusting the gate voltage to, for example, about 3.5 V, therefore, deterioration of the characteristics of the harmonic termination circuit 150C can be mitigated.

Figure 8:
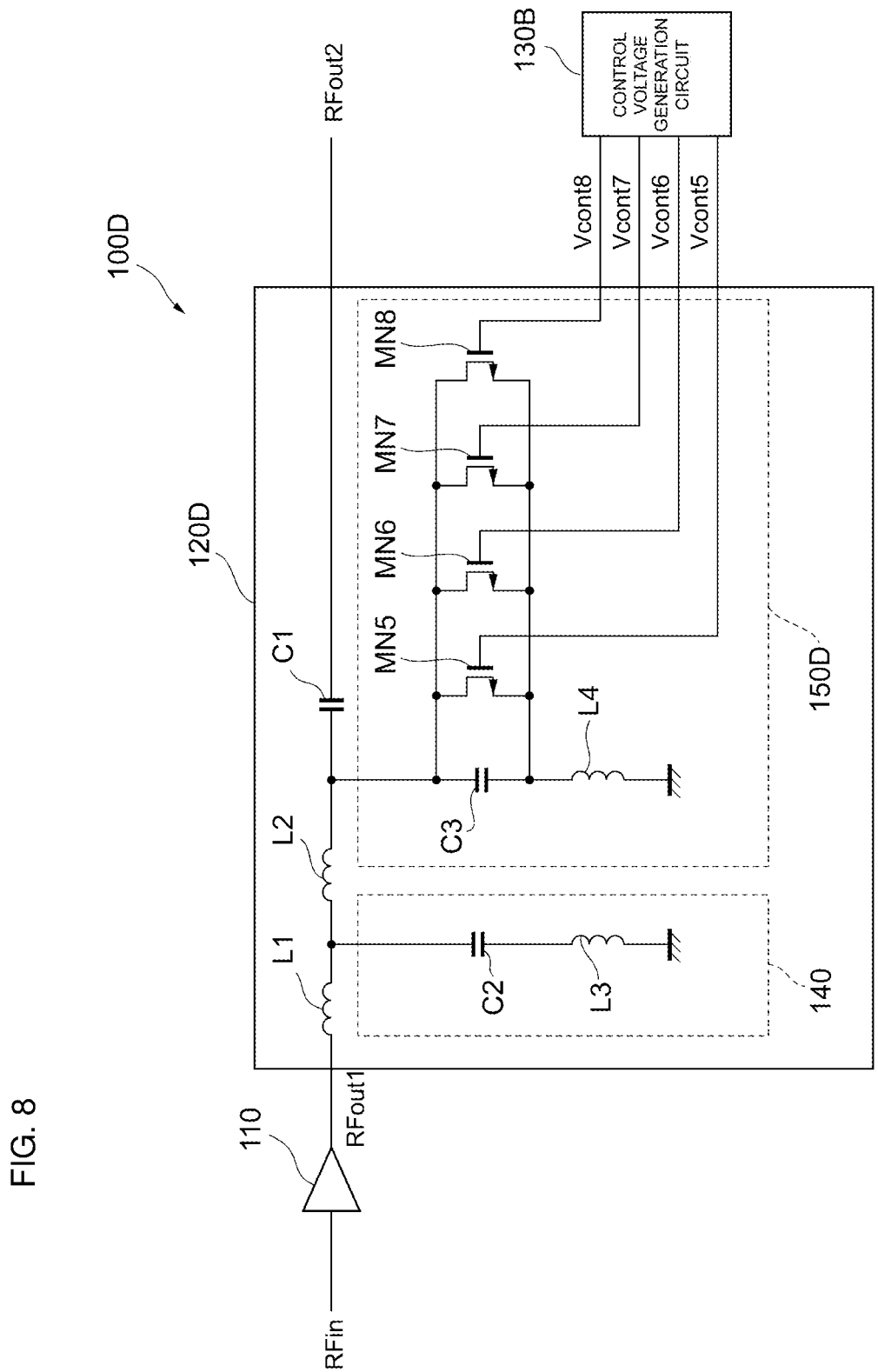
FIG. 8 is a diagram illustrating a configuration of a power amplifier module according to a modification of the second embodiment of the present disclosure.

FIG. 8 is a diagram illustrating a configuration of a power amplifier module according to a modification of the second embodiment of the present disclosure. Unlike the power amplifier module 100C illustrated in FIG. 6, a power amplifier module 100D illustrated in FIG. 8 includes a matching circuit 120D in place of the matching circuit 120C, and a control voltage generation circuit 130B in place of the control voltage generation circuit 130A. The matching circuit 120D includes a harmonic termination circuit 150D in place of the harmonic termination circuit 150C.

Unlike the harmonic termination circuit 150C, the harmonic termination circuit 150D further includes FETs (MN6, MN7, and MN8). The FETs (MN6, MN7, and MN8) are connected in parallel with the FET (MN5). That is, the FETs (MN5, MN6, MN7, and MN8) have drains connected to the first end of the capacitor C3, gates to which control voltages Vcont5, Vcont6, Vcont7, and Vcont8 are supplied, respectively, and sources connected to the second end of the capacitor C3. The functions of the FETs (MN5 to MN8) are similar to those of the FETs (MN1 to MN4) in the harmonic termination circuit 150B illustrated in FIG. 4 and are not described in detail herein.

Also in the configuration described above, similarly to the power amplifier module 100B, the power amplifier module 100D controls the control voltages Vcont5 to Vcont8 and can thus adjust the combined impedance Z of the harmonic termination circuit 150D and adjust the resonance frequency of the harmonic termination circuit 150D. Also with this configuration, the power amplifier module 100D can attain effects similar to those of the power amplifier module 100B illustrated in FIG. 4.

Next, a description will be given of an example of a method for adjusting a harmonic termination circuit in a power amplifier module according to an embodiment of the present disclosure. For example, power amplifier modules which have been manufactured undergo inspection of the characteristics of harmonic termination circuits and are screened as to whether or not the characteristics of the harmonic termination circuits satisfy predetermined criteria. Then, among the power amplifier modules that have been screened out since the characteristics of the harmonic termination circuits do not satisfy the predetermined criteria, a power amplifier module for which the characteristics of the harmonic termination circuit are expected to be enhanced by adjustment of the harmonic termination circuit in the way described above is selected and the adjustment described above is performed. As a result of the adjustment, if the characteristics of the harmonic termination circuit satisfy the predetermined criteria, the power amplifier module is shipped or otherwise, the power amplifier module is disposed of. In order to prevent the adjusted characteristics from being modified due to incorrect operation after the shipment of the power amplifier module, it is desirable to disable the adjustment described above after the power amplifier module has been shipped.

In this embodiment, for example, an element (e.g., an eFuse cell 131, etc.) whose output value can be changed by electronic programming is used for controlling the characteristics of a harmonic termination circuit. With the use of such an element, a state where the characteristics can be adjusted (i.e., a data rewritable state) can be changed to a state where the adjustment of the characteristics is disabled (i.e., a data non-rewritable state). An eFuse cell is an element whose resistance value is increased by the flow of large current to thereby change an output value, and has a property that the output value is not restored to the original value once the output value has been changed. Accordingly, the initial state of the eFuse cell 131 is set to a rewritable state and, in this state, a control voltage generated by a control voltage generation circuit is adjusted. Thereafter, a large current is caused to flow through the eFuse cell 131 to change the state of the eFuse cell 131 to a non-rewritable state. The operations described above allow the characteristics of the harmonic termination circuit to be kept appropriately adjusted and can prevent the adjusted characteristics from being modified due to incorrect operation after shipment.

Figure 9A:
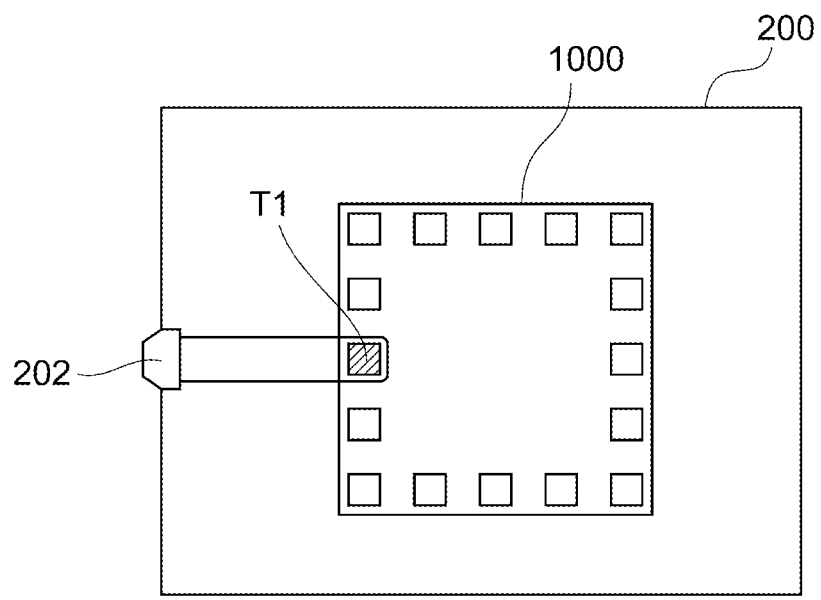
FIG. 9A is a schematic diagram of an example configuration of a power amplifier module according to an embodiment of the present disclosure when the power amplifier module is adjusted.
Figure 9B:
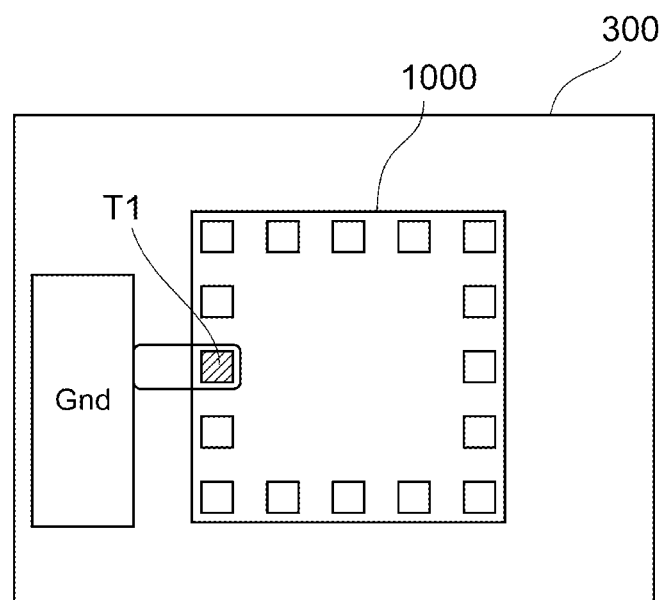
FIG. 9B is a schematic diagram of an example configuration of the power amplifier module according to the embodiment of the present disclosure after the power amplifier module has been adjusted.

Next, a description will be given of another example of the method for adjusting a harmonic termination circuit. FIG. 9A is a schematic diagram of an example configuration of a power amplifier module according to an embodiment of the present disclosure when the power amplifier module is adjusted, and FIG. 9B is a schematic diagram of an example configuration of the power amplifier module according to the embodiment of the present disclosure after the power amplifier module has been adjusted. As illustrated in FIGS. 9A and 9B, a power amplifier module 1000 according to an embodiment of the present disclosure includes a control terminal T1. The power amplifier module 1000 is placed on a screening jig 200 for inspection after manufacturing. At this time, a voltage of a predetermined level is supplied to the control terminal T1 from the outside via a connector 202 (see FIG. 9A). The power amplifier module 1000 can be configured such that the characteristics of a harmonic termination circuit can be adjusted only within a period during which the voltage of the predetermined level is supplied to the control terminal T1 from the outside. Thus, when the power amplifier module 1000 is located on the screening jig 200, a writing operation can be performed on the power amplifier module 1000 to adjust the characteristics of the harmonic termination circuit. After the completion of the adjustment for the harmonic termination circuit, the power amplifier module 1000 is mounted on a motherboard 300 in a product to be shipped. At this time, for example, ground potential is supplied to the control terminal T1 (see FIG. 9B). Thus, the writing operation is disabled while the power amplifier module 1000 is mounted on the motherboard 300. This configuration can also prevent the adjusted characteristics from being modified due to incorrect operation after the shipment of the power amplifier module. In this configuration, incorrect operation is prevented without necessarily the use of the eFuse cell 131 described above and a smaller number of components are thus used. In addition, it is no longer necessary to take time to perform a writing operation on the eFuse cell 131. The adjustment method for a power amplifier module is not limited to the methods described above.

Exemplary embodiments of the present disclosure have been described. Each of the power amplifier modules 100A to 100D includes the corresponding one of the harmonic termination circuits 150A to 150D, each including one or more FETs, and the corresponding one of the control voltage generation circuits 130A and 130B for controlling the gate voltage of the one or more FETs, and the capacitance value of the parasitic capacitance of the one or more FETs is adjusted and can thus adjust the resonance frequency of each of the harmonic termination circuits 150A to 150D. Therefore, even if variations are present from element to element, deterioration of the characteristics of a harmonic termination circuit is mitigated by correcting the resonance frequency of the harmonic termination circuit.

In the power amplifier modules 100A and 100B, the harmonic termination circuits 150A and 150B each include the capacitor C3 and the inductors L4 and L5, which are connected in series, the inductor L6, which is connected in parallel with the inductor L5, and the FET (MN1), which is connected in series with the inductor L6. By controlling the control voltage Vcont1, it is possible to adjust the parasitic capacitance and the resistance value of the on-resistance of the FET (MN1) and to switch between the conduction and non-conduction of current through the inductor L6. Thus, the combined impedance Z of each of the harmonic termination circuits 150A and 150B can be adjusted and the resonance frequency can be corrected.

In the power amplifier module 100B, the harmonic termination circuit 150B includes the FETs (MN1 to MN4), which are connected in parallel, and the control voltage generation circuit 130A individually controls the respective gate voltages of the FETs (MN1 to MN4). Thus, the combination of the on and off states of the FETs (MN1 to MN4) can be variously changed. Accordingly, the combined impedance Z of the harmonic termination circuit 150B can be adjusted and the resonance frequency can be corrected.

In the power amplifier modules 100C and 100D, the harmonic termination circuits 150C and 150D each include the capacitor C3 and the inductor L4, which are connected in series, and the FET (MN5), which is connected in parallel with the capacitor C3. By controlling the control voltage Vcont5, it is possible to adjust the parasitic capacitance and the resistance value of the on-resistance of the FET (MN5). Thus, the combined impedance Z of each of the harmonic termination circuits 150C and 150D can be adjusted and the resonance frequency can be corrected.

In the power amplifier module 100D, the harmonic termination circuit 150D includes the FETs (MN5 to MN8), which are connected in parallel, and the control voltage generation circuit 130B individually controls the respective gate voltages of the FETs (MN5 to MN8). Thus, the combination of the on and off states of the FETs (MN5 to MN8) can be variously changed. Accordingly, the combined impedance Z of the harmonic termination circuit 150B can be adjusted and the resonance frequency can be corrected.

In the harmonic termination circuits 150A to 150D, by way of example, an FET is connected in parallel with either an inductor or a capacitor. Each of the harmonic termination circuits 150A to 150D may include both an FET connected in parallel with an inductor and an FET connected in parallel with a capacitor. For example, if the resonance frequency shifts toward higher frequencies, the FET connected in parallel with the capacitor may be adjusted to correct the resonance frequency to a lower frequency, and, if the resonance frequency shifts toward lower frequencies, the FET connected in parallel with the inductor may be adjusted to correct the resonance frequency to a higher frequency.

Each FET included in the harmonic termination circuits 150A to 150D may be a P-channel FET instead of an N-channel FET.

The embodiments described above are intended for easy understanding of the present invention, and it is not intended to construe the present invention in a limiting fashion. Various modifications or improvements can be made to the present invention without departing from the gist of the present invention, and equivalents thereof are also included in the present invention. That is, the embodiments may be appropriately modified in design by those skilled in the art, and such modifications also fall within the scope of the present invention so long as the modifications include the features of the present invention. For example, the elements included in the embodiments and the arrangement, materials, conditions, shapes, sizes, and the like thereof are not limited to those described in the illustrated examples but can be modified as appropriate. In addition, the elements included in the embodiments can be combined as much as technically possible, and such combinations of elements also fall within the scope of the present invention so long as the combinations of elements include the features of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power amplifier module comprising:
an amplifier that amplifies an input signal and outputs the amplified signal;
a harmonic termination circuit that is disposed subsequent to the amplifier and that attenuates a harmonic component of the amplified signal, the harmonic termination circuit comprising at least one field effect transistor; and
a control circuit configured to control a gate voltage of the at least one field effect transistor thereby adjusting a parasitic capacitance of the at least one field effect transistor,
wherein by adjusting the parasitic capacitance of the at least one field effect transistor, the control circuit thereby also adjusts a resonance frequency of the harmonic termination circuit,
wherein the harmonic termination circuit comprises a capacitor and a first inductor that are connected in series between an output terminal of the amplifier and a reference potential, and a second inductor connected in parallel with the first inductor, and
wherein the control circuit is adjusted by an eFuse cell.

2. The power amplifier module according to claim 1, wherein the at least one field effect transistor is connected in series with the second inductor.

3. The power amplifier module according to claim 1, comprising a plurality of field effect transistors, each of the plurality of field effect transistors being connected in parallel with each other and in series with the second inductor,
wherein the control circuit individually controls respective gate voltages of the plurality of field effect transistors.

4. The power amplifier module according to claim 1, further comprising a third transistor connected in series between the capacitor and the first inductor.

5. The power amplifier module according to claim 2, further comprising a third transistor connected in series between the capacitor and the first inductor.

6. The power amplifier module according to claim 3, further comprising a third transistor connected in series between the capacitor and the first inductor.

7. The power amplifier module according to claim 1,
wherein the control circuit comprises an integrated circuit and a digital-to-analog converter, and
wherein the digital-to-analog converter is configured to generate the gate voltage of the at least one field effect transistor in accordance with a signal from the integrated circuit.

8. A power amplifier module comprising:
an amplifier that amplifies an input signal and outputs the amplified signal;
a harmonic termination circuit that is disposed subsequent to the amplifier and that attenuates a harmonic component of the amplified signal, the harmonic termination circuit comprising at least one field effect transistor; and
a control circuit configured to control a gate voltage of the at least one field effect transistor thereby adjusting a parasitic capacitance of the at least one field effect transistor,
wherein by adjusting the parasitic capacitance of the at least one field effect transistor, the control circuit thereby also adjusts a resonance frequency of the harmonic termination circuit is adjusted,
wherein the harmonic termination circuit comprises a capacitor and a first inductor that are connected in series between an output terminal of the amplifier and a reference potential, and
wherein the control circuit is adjusted by an eFuse cell.

9. The power amplifier module according to claim 8, wherein the at least one field effect transistor is connected in parallel with the capacitor.

10. The power amplifier module according to claim 8, comprising a plurality of field effect transistors, each of the plurality of field effect transistors being connected in parallel with each other and the capacitor,
wherein the control circuit individually controls respective gate voltages of the plurality of field effect transistors.

11. The power amplifier module according to claim 8,
wherein the control circuit comprises an integrated circuit and a digital-to-analog converter, and
wherein the digital-to-analog converter is configured to generate the gate voltage of the at least one field effect transistor in accordance with a signal from the integrated circuit.

* * * * *